United States Patent [19]

Baliga

[11] Patent Number: 5,637,898
[45] Date of Patent: Jun. 10, 1997

[54] VERTICAL FIELD EFFECT TRANSISTORS HAVING IMPROVED BREAKDOWN VOLTAGE CAPABILITY AND LOW ON-STATE RESISTANCE

[75] Inventor: Bantval J. Baliga, Raleigh, N.C.

[73] Assignee: North Carolina State University, Raleigh, N.C.

[21] Appl. No.: 577,859

[22] Filed: Dec. 22, 1995

[51] Int. Cl.$^6$ .................................................. H01L 29/94
[52] U.S. Cl. ........................... 257/330; 257/331; 257/333; 257/342
[58] Field of Search ........................... 257/330, 331, 257/333, 342

[56] References Cited

U.S. PATENT DOCUMENTS

| | | | |
|---|---|---|---|
| 3,412,297 | 11/1968 | Amlinger | 257/330 |
| 4,288,801 | 9/1981 | Ronen | 257/337 |
| 4,893,160 | 1/1990 | Blanchard | 257/334 |
| 4,903,189 | 2/1990 | Ngo et al. | 363/127 |
| 4,914,058 | 4/1990 | Blanchard | 257/333 |
| 5,072,266 | 12/1991 | Bulucea et al. | 357/23.4 |
| 5,202,750 | 4/1993 | Gough | 257/133 |
| 5,233,215 | 8/1993 | Baliga | 257/490 |
| 5,283,201 | 2/1994 | Tsang et al. | 437/31 |
| 5,298,781 | 3/1994 | Cogan et al. | 257/333 |
| 5,323,040 | 6/1994 | Baliga | 257/332 |
| 5,473,176 | 12/1995 | Kakumoto | 257/333 |
| 5,558,313 | 9/1996 | Hshieh et al. | 257/342 |

FOREIGN PATENT DOCUMENTS

0494597A1  7/1992  European Pat. Off. .

OTHER PUBLICATIONS

Y. Babe, et al., *A Study on a High Blocking Voltage UMOS-FET with a Double Gate Structure*, Proceedings of 1992 International Symposium on Power Semiconductor Devices & ICs, Tokyo, pp. 300–302. No Month.

M. Bhatnagar and B. J. Baliga, *Analysis of Silicon Carbide Power Device Performance*, IEEE, 1991, pp. 176–180. No Month.

T. Syau, et al., *Extended Trench–Gate Power UMOSFET Structure with Ultralow Specific On–Resistance*, Electronics Letters, vol. 28, No. 9, Apr., 1992, pp. 865–867.

(List continued on next page.)

*Primary Examiner*—Jerome Jackson
*Assistant Examiner*—John Guay
*Attorney, Agent, or Firm*—Bell, Seltzer, Park & Gibson

[57] ABSTRACT

A power transistor having high breakdown voltage and low on-state resistance includes a vertical field effect transistor in a semiconductor substrate having a plurality of source, channel, drift and drain regions therein. A trench having a bottom in the drift region and opposing sidewalls which extend adjacent the drift, channel and source regions is also provided in the substrate, at a face thereof. The trench preferably includes an insulated gate electrode therein for modulating the conductivity of the channel and drift regions in response to the application of a turn-on gate bias. The insulated gate electrode includes an electrically conductive gate in the trench and an insulating region which lines a sidewall of the trench adjacent the channel and drift regions. The insulating region has a nonuniform cross-sectional area between the trench sidewall and the gate which enhances the forward voltage blocking capability of the transistor by inhibiting the occurrence of high electric field crowding at the bottom of the trench. The thickness of the insulating region is preferably greater than 1500 Å along the portion of the sidewall which extends adjacent the drift region and less than 750 Å along the portion of the sidewall which extends adjacent the channel region. To provide low on-state resistance, the drift region is also nonuniformly doped to have a linearly graded doping profile which decreases from greater than about $1\times10^{17}$ cm$^{-3}$ to less than about $5\times10^{-16}$ cm$^{-3}$ in a direction from the drain region to the channel region.

7 Claims, 6 Drawing Sheets

OTHER PUBLICATIONS

Hiroo Fuma, et al., *High Temperature Operated Enhancement–Type β–SiC MOSFET*, Japanese Journal of Applied Physics, vol. 27, No. 11, Nov., 1988, pp. L2143–L2145.

B. Jayant Baliga, *Power MOSFET*, Chapter 7, Power Semiconductor Devices, 1996, pp. 335–425. No Month.

H.–R. Chang, *Numerical And Experimental Comparison Of 60V Vertical Double–Diffused MOSFETS And MOSFETS With A Trench–Gate Structure*, Solid–State Electronics, vol. 32, no. 3, 1989, pp. 247–251.

S. Merchant, et al., *Realization Of High Breakdown Voltage (>700V) In Thin SOI Devices*, IEEE, 1991, pp. 31–35. No Month.

T. Syau, et al., *Comparison Of Ultralow Specific On–Resistance UMOSFET Structures: The ACCUFET, EXTFET, INVFET, and Conventional UMOSFET's*, IEEE Transactions on Electron Devices, vol. 41, No. 5, May 1994, pp. 800–808.

M. Bhatnagar, et al., *SiC Power UMOSFET: Design, Analysis And Technological Feasibility*, Inst. Phys. Conf. Ser. No. 137: Chapter 7, 1994, pp. 703–706. No Month.

B. Jayant Baliga, *New Materials Beyond Silicon For Power Devices*, Power Semiconductor Devices and Circuits, 1992, pp. 377–389. No Month.

Bhatnagar, et al., *Comparison of 6H–SiC, 3C–SiC, and Si For Power Devices*, IEEE Transactions On Electron Devices, vol. 40, No. 3, Mar. 1993, pp. 645–655.

Alok, et al., *Thermal Oxidation of 6H–Silicon Carbide at Enhanced Growth Rates*, IEEE Electron Device Letters, vol. 15, No. 10, Oct. 1994, pp. 424–426.

Shenoy et al., *Planar, Ion Implanted, High Voltage 6H–SiC P–N Junction Diodes*, IEEE Electron Device Letters, vol. 16, No. 10, Oct. 1995, pp. 454–456.

A. Moki, et al., *Low Resistivity As–Deposited Ohmic Contacts to 3C–SiC*, Journal of Electronic Materials, vol. 24, No. 4, 1995, pp. 315–318. No Month.

Alok, et al., *A Novel Method For Etching Trenches In Silicon Carbide*, Journal of Electronic Materials, vol. 24, No. 4, 1995, pp. 311–314. No Month.

Alok, et al., *Electrical properties of thermal oxide grown using dry oxidation on p–type 6H–silicon carbide*, Appl. Phys. Lett., vol. 65, No. 17, Oct. 24, 1994, pp. 2177–2178.

Alok, et al., *A Simple Edge Termination for Silicon Carbide Devicces with Nearly Ideal Breakdown Voltgage*, IEEE Electron Device Letters, vol. 15, No. 10, Oct. 1994, pp. 394–395.

Alok, et al., *Electrical properties of thermal oxide grown on n–type 6H–silicon carbide*, Appl. Phys. Lett., vol. 64, No. 21, May 23, 1994, pp. 2845–2846.

Alok, et al., *Low Contact Resistivity Ohmic Contacts to 6H–Silicon Carbide*, IEDM 93, pp. 691–695. No Date.

M. Bhatnagar, et al., *Comparison Of Ti And Pt Silicon Carbide Schottky Rectifiers*, IEDM 92, pp. 789–792. No Date.

M. Bhatnagar, et al., *Silicon–Carbide High–Voltage (400 V) Schottky Barrier Diodes*, IEEE Electron Device Letters, vol. 13, No. 10, Oct. 1992, pp. 501–503.

VERTICAL FIELD EFFECT TRANSISTORS HAVING IMPROVED BREAKDOWN VOLTAGE CAPABILITY AND LOW ON-STATE RESISTANCE

FIELD OF THE INVENTION

The present invention relates to semiconductor switching devices, and more particularly to switching devices for high power applications.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000 V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the barge base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter hallasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type channel region in response to the application of a positive gate bias. The inversion layer electrically connects the N-type source and drain regions and allows for majority carrier conduction therebetween.

The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carrier transport only, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop of power MOSFETs increases with increasing temperature, thereby promoting an even current distribution in parallel connected devices.

In view of these desirable characteristics, many variations of power MOSFETs have been designed. Two popular types are the double-diffused MOSFET device (DMOSFET) and the UMOSFET device. These and other power MOSFETs are described in a textbook by B. J. Baliga entitled *Power Semiconductor Devices*, PWS Publishing Co. (ISBN 0-534-94098-6) (1995), the disclosure of which is hereby incorporated herein by reference. Chapter 7 of this textbook describes power MOSFETs at pages 335–425. Examples of silicon power MOSFETs including accumulation, inversion and extended trench FETs having trench gate electrodes extending into the N+ drain region are also disclosed in an article by T. Syau, P. Venkatraman and B. J. Baliga, entitled *Comparison of Ultralow Specific On-Resistance UMOSFET Structures: The ACCUFET, EXTFET, INVFET, and Convention UMOSFETs*, IEEE Transactions on Electron Devices, Vol. 41, No. 5, May (1994). As described by Syau et al., specific on-resistances in the range of 100–250 µΩcm$^2$ were experimentally demonstrated for devices capable of supporting a maximum of 25 volts. However, the performance of these devices was limited by the fact that the forward voltage was supported across the gate oxide at the bottom of the trench instead of the semiconductor substrate.

FIG. 1, which is a reproduction of FIG. 1(d) from the aforementioned Syau et al. article, discloses a conventional UMOSFET structure. In the blocking mode of operation, this UMOSFET supports most of the forward voltage across the N- drift layer which can be doped at relatively low levels to obtain a high maximum blocking voltage capability, however low doping levels typically increase the on-state series resistance. Based on these competing design requirements of high blocking voltage and low on-state resistance, a fundamental figure of merit for power devices has been derived which relates specific on-resistance ($R_{on,sp}$) to the maximum blocking voltage (BV). As explained at page 373 of the aforementioned textbook to B. J. Baliga, the ideal specific on-resistance for an N-type silicon drift region is given by the following relation:

$$R_{on,sp} = 5.93 \times 10^{-9} (BV)^{2.5}$$

Thus, for a device with 60 volt blocking capability, the ideal specific on-resistance is 170 µΩcm$^2$. However, because of the additional resistance contribution from the channel region (P base), reported specific on-resistances for UMOSFETs are typically much higher. For example, a UMOSFET having a specific on-resistance of 730 µΩcm$^2$ is disclosed in an article by H. Chang, entitled *Numerical and Experimental Comparison of 60V Vertical Double-Diffused MOSFETs and MOSFETs With A Trench-Gate Structure*, Solid-State Electronics, Vol. 32, No. 3, pp. 247–251, (1989). However, in this device a lower-than-ideal uniform doping concentration in the drift region was required to compensate for the high concentration of field lines near the bottom corner of the trench when blocking high forward voltages.

Thus, notwithstanding these attempts to develop power MOSFETs with high maximum blocking voltage capability and low specific on-resistance, there still continues to be a need to develop improved power MOSFETs which are capable of blocking forward voltages greater than 25 volts and which have specific on-resistances below 100–250 $\mu\Omega cm^2$.

SUMMARY OF THE INVENTION

It is therefore an object of the present invention to provide a power transistor which has low on-state resistance and high maximum blocking voltage capability, and methods of forming same.

It is another object of the present invention to provide a power transistor which is capable of handling high forward current densities with low gate drive power requirements, and methods of forming same.

It is a further object of the present invention to provide a power transistor which does not experience switching delays caused by minority carrier storage and recombination, and methods of forming same.

These and other objects are provided, according to the present invention, by a power field effect transistor which comprises a plurality of vertically spaced source, channel, drift and drain regions between first and second opposing faces of a semiconductor substrate and an insulated gate electrode for modulating the conductivity of the channel and drift regions upon the application of a potential bias thereto. According to a preferred embodiment of the present invention, the insulated gate electrode is formed in a trench at the first face of the substrate. The insulated gate electrode comprises an insulating region which lines a bottom and a sidewall(s) of the trench and an electrically conductive gate on the insulating region. The insulating region is formed to have a nonuniform cross-sectional area between the trench sidewall and the gate which enhances the forward voltage blocking capability of the transistor by preventing the occurrence of high electric field crowding at the bottom corner of the trench. In particular, the thickness of the insulating region is preferably greater than about 1000 Å along a portion of the sidewall which extends adjacent the drift region and the bottom of the trench, but less than about 1000 Å along a portion of the sidewall which extends adjacent the channel region. More preferably, the insulating region has a thickness greater than 1500 Å along the portion of the sidewall which extends adjacent the drift region and bottom and has a thickness less than 750 Å along the portion of the sidewall which extends adjacent the channel region.

To provide low on-state resistance, the drift region is also nonuniformly doped to have a linearly graded doping profile which decreases from greater than about $1 \times 10^{17}$ cm$^{-3}$ to less than about $5 \times 10^{16}$ cm$^{-3}$ in a direction from the drain region to the channel region. The drift and channel regions preferably have first and second conductivity type dopants therein, respectively, so that the application of a turn-on bias to the gate causes the formation of an inversion layer channel and an accumulation layer channel in the channel and drift regions, respectively, adjacent the trench sidewall. These first conductivity type channels (e.g., N-type) provide a path for majority carriers to flow from the source region to the drift region upon the application of a potential bias to the drain region. The relatively low doping of the drift region at the P-N junction with the channel region also inhibits the occurrence of reach-through breakdown across the channel region. The channel region can therefore be made thin (e.g., 0.5 μm) to further lower the on-state series resistance of the transistor, by lowering the length of the inversion layer channel, and can be doped to a relatively low maximum value to maintain the transistor's threshold voltage at about 2–3 volts.

A method of forming a power field effect transistor according to the present invention includes the steps of forming a semiconductor substrate having a highly doped drain region of first conductivity type, a non-uniformly doped drift region of first conductivity type on the drain region, a thin channel region of second conductivity type on the drift region and a highly doped source region of first conductivity type on the channel region. A U-shaped trench which extends vertically through the source and channel regions and into the drift region is then formed in the substrate. An insulated gate electrode is then formed in the trench by lining an interior of the trench with a gate insulating region and then forming an electrically conductive gate on the gate insulating region.

In particular, a method according to the present invention includes the steps of epitaxially growing a nonuniformly in-situ doped drift region of first conductivity type on a highly doped drain region of first conductivity type to form a first conductivity type substrate having an abrupt non-rectifying junction (e.g., N+/N) at an interface between the drift region and the drain region. The channel region (e.g., P-type) and the highly doped source region (e.g., N+) are then formed by implanting respective dopants and diffusing these dopants into the drift region to respective depths so that the channel region forms first and second opposing P-N junctions with the source and drift regions, respectively. A relatively deep trench is then formed at a face of the substrate by etching through the source and channel regions and into the drift region so that a sidewall of the trench defines an interface between an interior of the trench and the source, channel and drift regions. An insulated gate electrode for modulating the conductivity of the channel and drift regions by forming inversion layer and accumulation layer channels therein, respectively, upon the application of a turn-on gate bias, is then formed in the trench.

The insulated gate electrode is preferably formed by forming a first electrically insulating region (e.g., SiO$_2$) having a first thickness (e.g., 2000 Å) on the trench sidewall, opposite the drift region, and then forming a first polycrystalline silicon region on the first electrically insulating region. A second electrically insulating region of second thickness (e.g., 500 Å), less than the first thickness, is also formed on the trench sidewall, opposite the channel and source regions. A second polycrystalline silicon region is then formed on the second electrically insulating region and on the first polycrystalline silicon region to form a T-shaped gate electrode when view in transverse cross-section. A third electrically insulating region is then formed on the second polycrystalline region to complete the insulated gate electrode comprising the first and second polycrystalline silicon regions and the first, second and third electrically insulating regions. Contacts can then be made to the gate electrode and to the source and drain regions to form a preferred three-terminal power IGFET having a linearly graded doping concentration in the drift region which compensates for the relatively thick insulating region between the gate electrode and the drift region. In accordance with this method, a power field effect transistor having a forward blocking voltage capability greater than 25 volts with a specific on-resistance less than 100 $\mu\Omega cm^2$ can be achieved.

DESCRIPTION OF PREFERRED EMBODIMENTS

Figure 1:
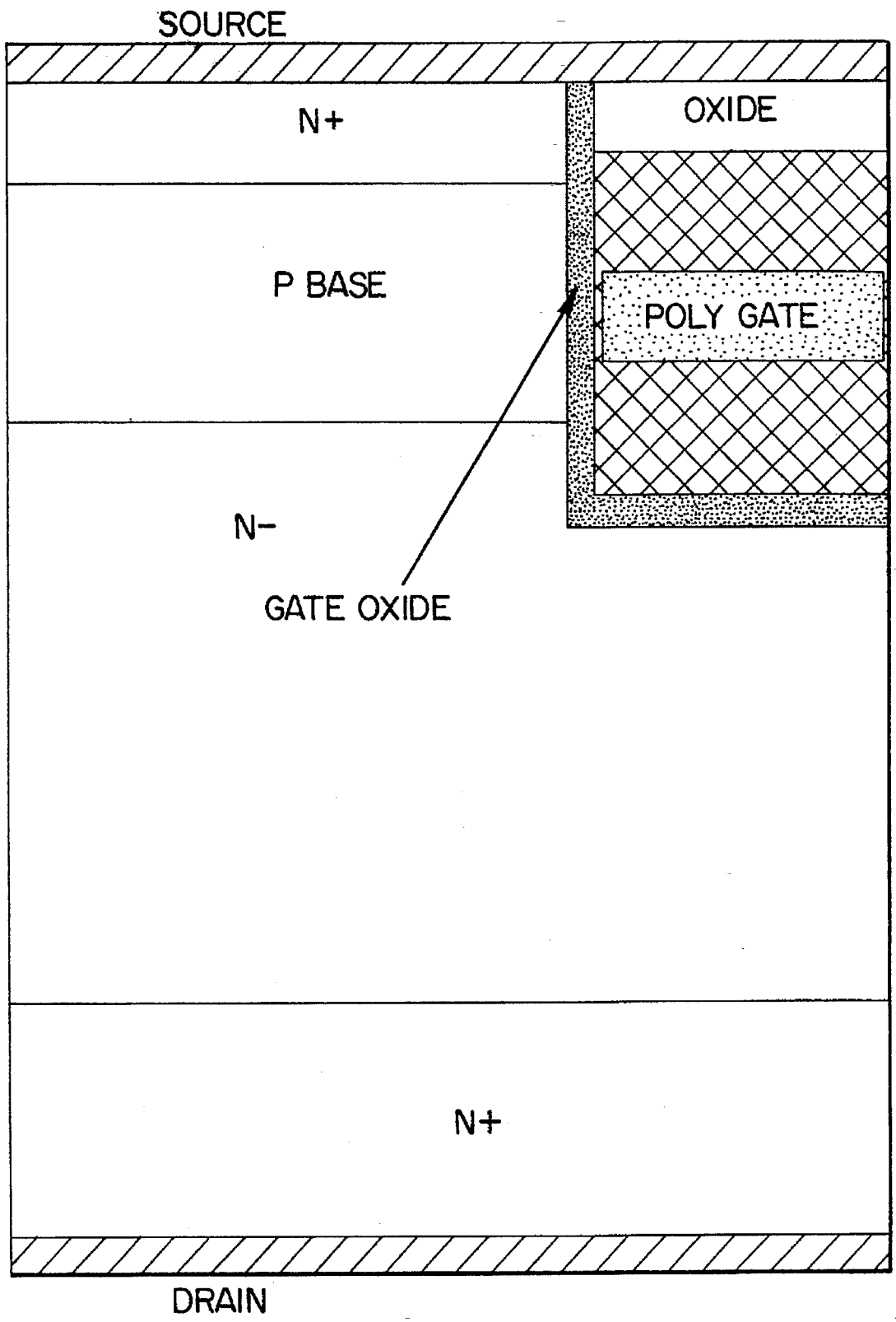
FIG. 1 illustrates a cross section of a prior art silicon UMOSFET.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type, however, each embodiment described and illustrated herein includes its complementary embodiment as well.

Referring now to FIGS. 2A–2K, a method of forming a power field effect transistor according to the present invention and transistor formed thereby will be described. In accordance with this method, a power UMOSFET having a maximum blocking voltage of at least 60 volts and an ultralow specific on-resistance of 40 $\mu\Omega cm^2$, which is four (4) times smaller than the ideal specific on-resistance of 170 $\mu\Omega cm^2$ for a 60 volt power UMOSFET, can be achieved. As illustrated best by FIG. 2A, the method begins with the step of forming a semiconductor substrate 10 by epitaxially growing a drift region 12 of first conductivity type (e.g., N-type) on a highly doped drain region 14 of first conductivity type which has a doping concentration greater than $1\times10^{18}$ cm$^{-3}$ therein. Computer controlled in-situ doping of the drift region 12 is also preferably performed during the epitaxial growth step so that the drift region 12 has a linearly graded (or step graded) first conductivity type doping concentration which decreases in a direction away from the drain region 14. In particular, the drift region 12 is preferably doped so that the doping concentration of the drift region 12 at the abrupt non-rectifying junction (J3) is greater than about $1\times10^{17}$ cm$^{-3}$ and more preferably about $3\times10^{17}$ cm$^{-3}$, but less than $5\times10^{16}$ cm$^{-3}$ at the first face 15a and more preferably only about $1\times10^{16}$ cm$^{-3}$ at the first face 15a.

Figure 2A:
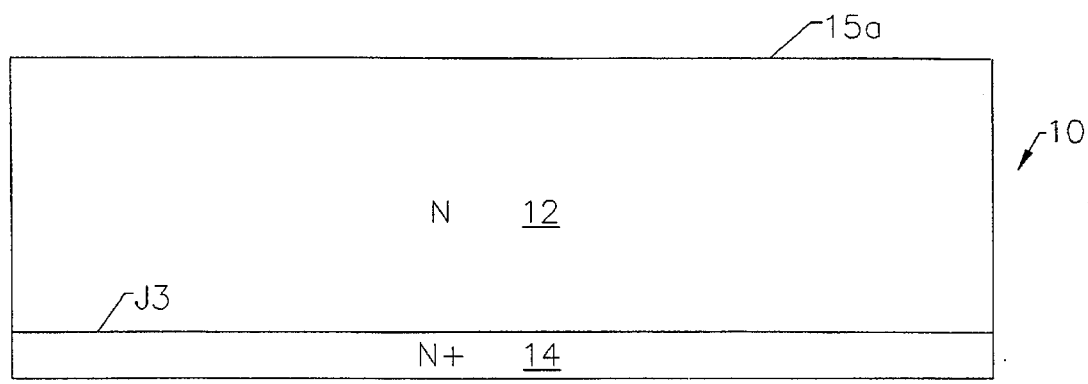
FIGS. 2A–2K illustrate a method of forming a field effect transistor and field effect transistor formed thereby, according to the present invention.
Figure 2B:
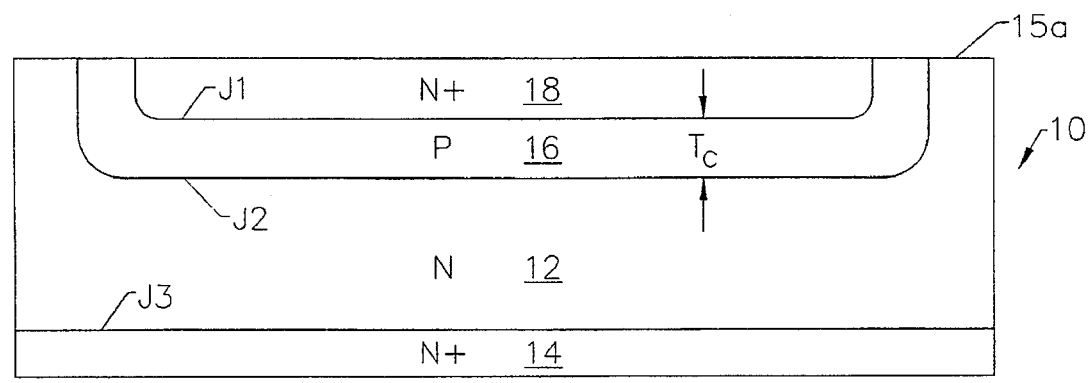

Referring now to FIG. 2B, a thin channel region 16 is then formed in the substrate 10 by patterning a first implant mask (not shown) on the first face 15a and then performing an implant of second conductivity type dopants for a channel region 16 through the first mask. The implanted second conductivity type dopants can then be diffused into the drift region 12 to an initial depth of about 0.5 μm. These steps are then preferably followed by the steps of patterning a second implant mask (not shown) on the first face 15a and performing an implant of first conductivity type dopants for a source region 18 through the second mask. The second mask is also preferably patterned in a third dimension (not shown) so that portions of the underlying channel region 16 do not receive the implanted source dopants. These portions, which extend to the first face 15a, can be ohmically contacted at the end of processing. The implanted first conductivity type dopants and the second conductivity type dopants can then be diffused to a depth of about 0.5 μm and 1.0 μm, respectively, to provide a channel region thickness "$T_c$" of about 0.5 μm. Preferably, boron (B) is used as a P-type dopant and is implanted at a dose of $1\times10^{14}$ cm$^{-2}$ and at an energy of 100 keV. Arsenic (As) is preferably used as an N-type dopant and is implanted at a dose of $1\times10^{15}$ cm$^{-2}$ and at an energy of 50 KeV. Although not shown, the edges of the diffused source and channel regions can be properly terminated using conventional techniques such as those described in section 3.6 of the aforementioned Baliga textbook at pages 81–113.

As will be understood by those skilled in the art, the implant and diffusion steps will cause the doping profile of the second conductivity type dopants in the substrate 10 to be generally gaussian in shape and have a maximum value at the first face 15a. The doping concentration in the channel region 16 will also have a maximum value adjacent the source region 18 and a minimum value adjacent the drift region 12. In particular, the implant and diffusion steps are performed so that the first conductivity type dopant concentration of the source region 18 at the first face 15a is greater than $1\times10^{18}$ cm$^{-3}$ and the second conductivity type dopant concentration in the channel region 16 is greater than about $1\times10^{17}$ cm$^{-3}$ at a first P-N junction (J1) with the source region 18, but less than about $5\times10^{16}$ cm$^{-3}$ and more preferably about $1\times10^{16}$ cm$^{-3}$ at the second P-N junction (J2) with the drift region 12. To meet these criteria, the first conductivity type doping concentration in the drift region 12 should be about $1\times10^{16}$ cm$^{-3}$ at the second P-N junction (J2). Because of this relatively low value of $1\times10^{16}$ cm$^{-3}$ in the drift region 12, the channel region 16 can be made thin (e.g., 0.5 μm) without being susceptible to parasitic reach-through breakdown and can be doped relatively low to maintain the transistor's threshold voltage at about 2–3 volts.

Figure 2C:
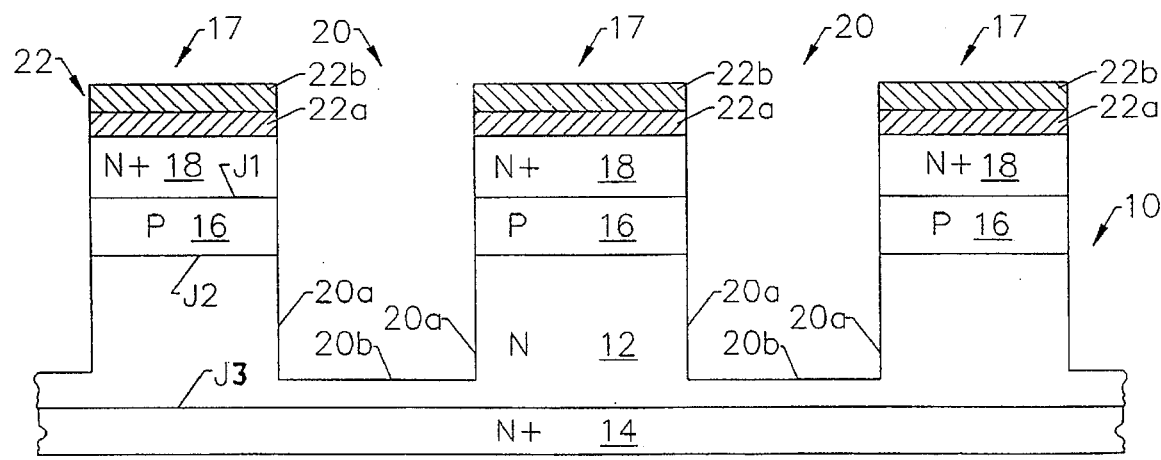

Referring now to FIG. 2C, an etching mask 22 including a stress relief oxide layer 22a and an oxide barrier layer 22b (e.g., $Si_3N_4$) is then patterned on the first face 15a to define openings which expose adjacent portions of the first face extending over the source and channel regions 18 and 16. The source, channel and drift regions are then chemically etched to form a plurality of trenches 20. As illustrated, each of the trenches has opposing vertical sidewalls 20a, which define interfaces between the source, channel and drift regions and an interior of the trench, and a trench bottom 20b in the drift region. Facing sidewalls 20a of adjacent trenches also define respective mesas 17 which preferably have uniform widths of about 0.5 μm at the end of processing. The trenches 20 and mesas 17, which extend in a third dimension, not shown, can be of stripe or similar geometry. The mesas 17 can also be polygonal (e.g., hexagonal) in shaped with the trenches 20 defining a continuous mesh when viewed from the face 15a. As explained more fully hereinbelow, the widths of the mesas 17 can be selected to improve the blocking voltage capability of the transistor. In particular, the width of the mesas 17 (at the end of processing) and the doping concentration in the drift region 12 at J3 should be selected so that their product is within the range of $1\times10^{-13}$–$2\times10^{13}$ cm$^{-2}$ to obtain a preferred charge concentration in the drift region 12. In addition, the width of the mesas 17 and the doping concentration in the drift region 12 at J2 should be selected so that their product is within the range of $1\times10^{11}$–$2\times10^{12}$ cm$^{-2}$.

Figure 2D:
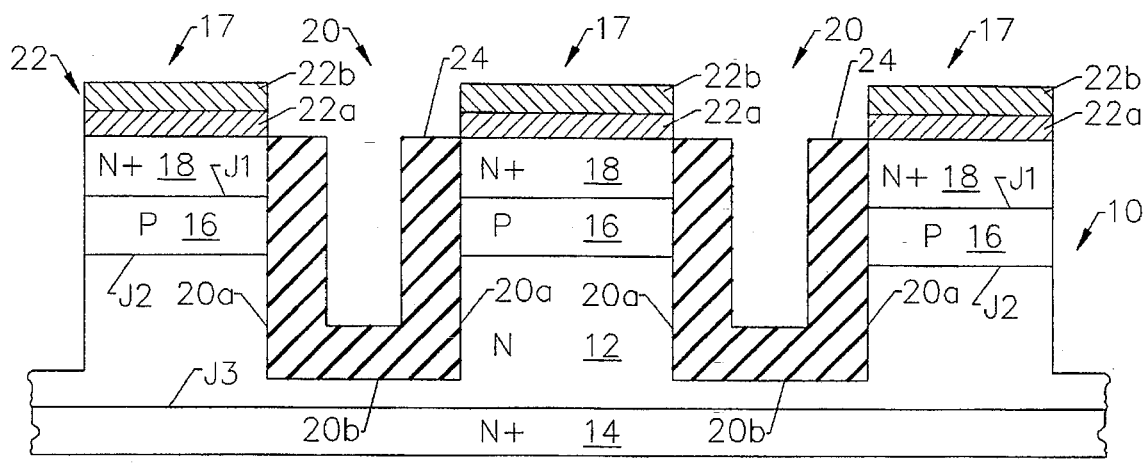
Figure 2E:
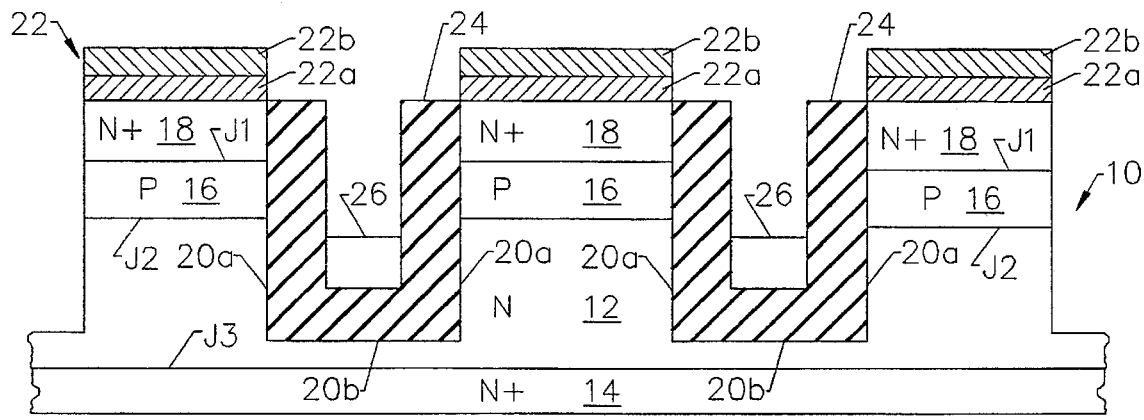
Figure 2F:
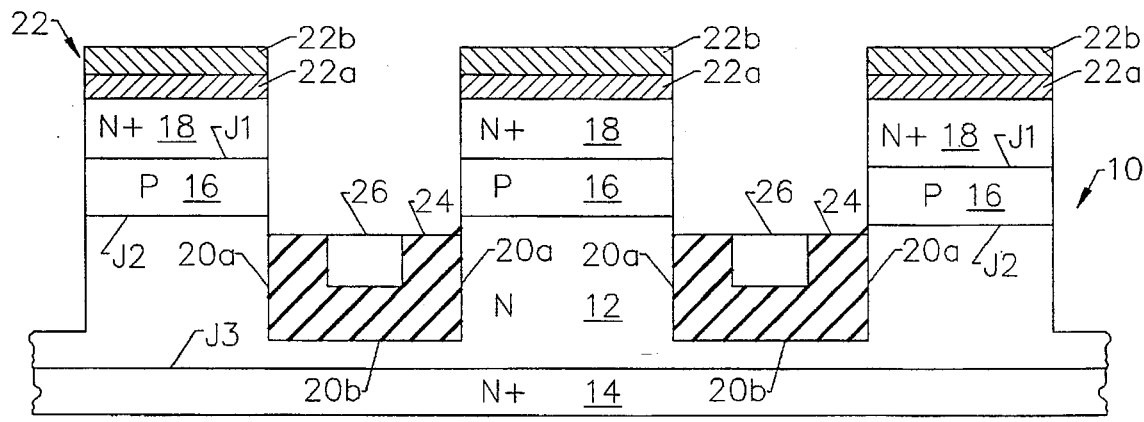

Referring now to FIG. 2D which illustrates a cross-section of three adjacent mesas 17, the method continues with the formation of a first electrically insulating region 24 (e.g., $SiO_2$) having a first thickness greater than 1000 Å and more preferably about 2000 Å, on the trench sidewalls 20a and the trench bottom 20b of each trench 20. This step is preferably performed by oxidizing the etched source, channel and drift regions, using the oxide barrier layer 22b as an oxidation mask. As will be understood by those skilled in the art, the growth of an oxide having a thickness of about 2000 Å will typically consume about 0.1 μm of semiconductor material. Accordingly, the initial widths of the mesas 17 should be selected so that at the end of processing the widths are at the desired value of about 0.5 μm.

Figure 2G:
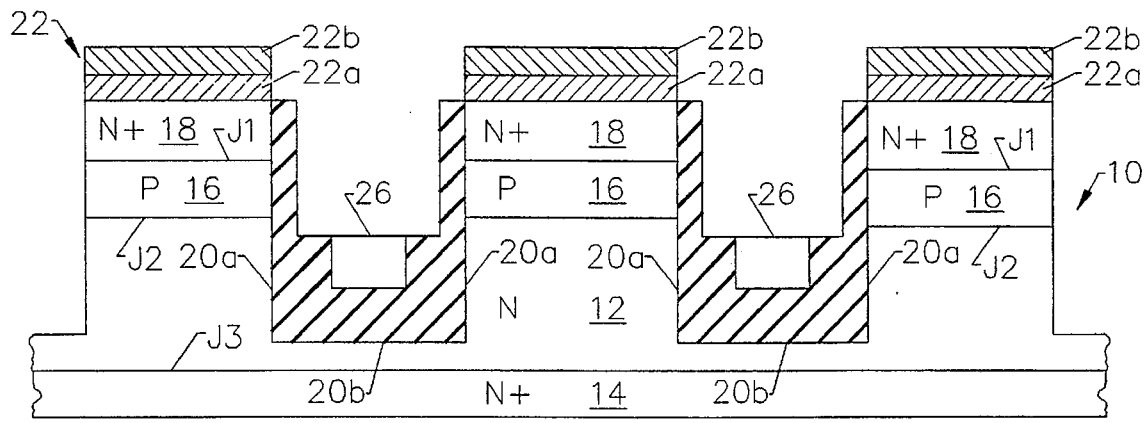
Figure 2H:
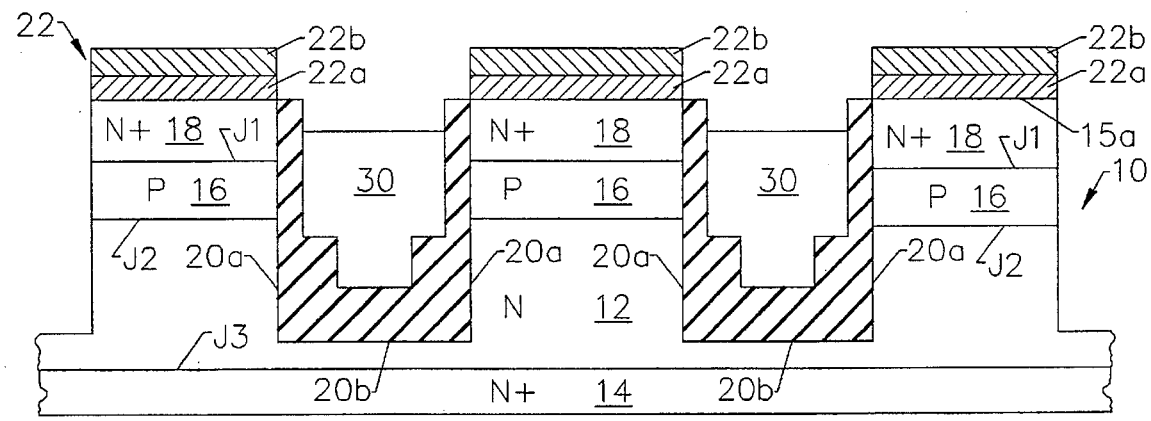

Referring now to FIGS. 2E–2K, a conformal N-type first polycrystalline silicon region 26 is then deposited and etched until it is recessed in the trench to a depth just below the second P-N junction (J2). An oxide etching step is then performed to remove the first electrically insulating region 24 from the portions of the sidewalls 20a which extend adjacent the etched source and channel regions 18 and 16, as illustrated best by FIG. 2F. Referring now to FIG. 2G, a second electrically insulating region 28 (e.g., $SiO_2$) having a second thickness less than about 1000 Å and more preferably about 500 Å, is then formed on the trench sidewalls 20a, adjacent the etched source and channel regions. The second electrically insulating region 28 is then selectively etched from the top of the first polycrystalline silicon region 26 but not the sidewalls 20a, using a reactive ion etching (RIE) technique. Referring now to FIG. 2H, a conformal second polycrystalline silicon region 30 is then deposited on the first polycrystalline region 26 and the second electrically insulating region 28. The second polycrystalline silicon region 30 is then etched until it is recessed in the trench to a depth just below the first face 15a.

Figure 2I:
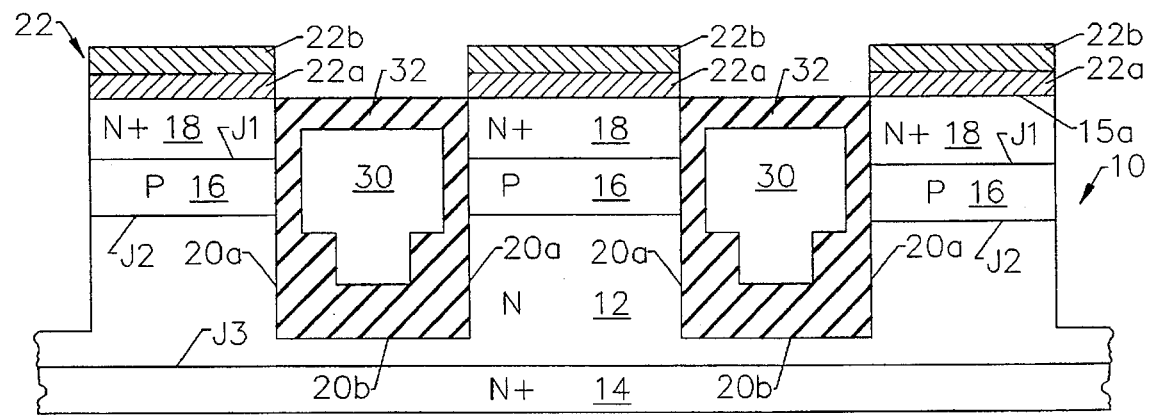
Figure 2J:
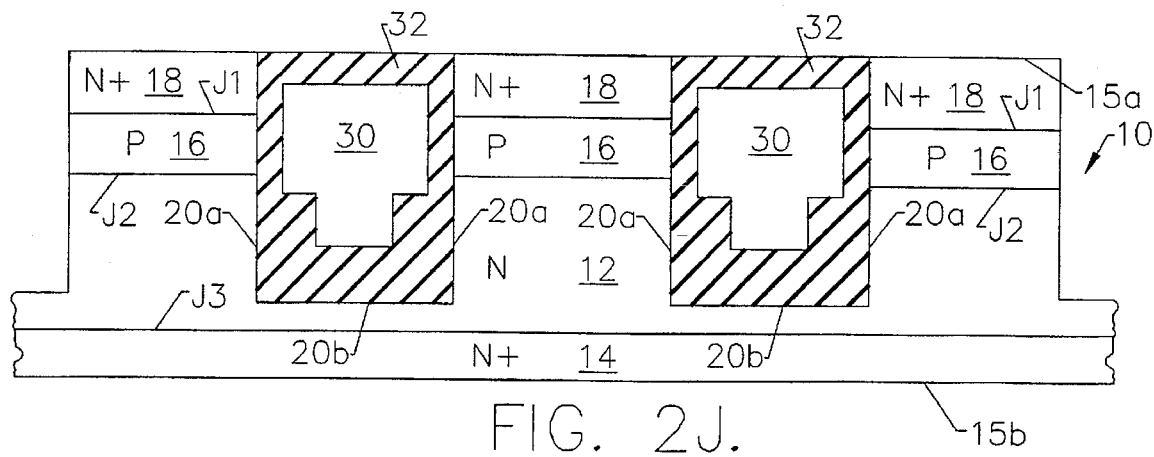
Figure 2K:
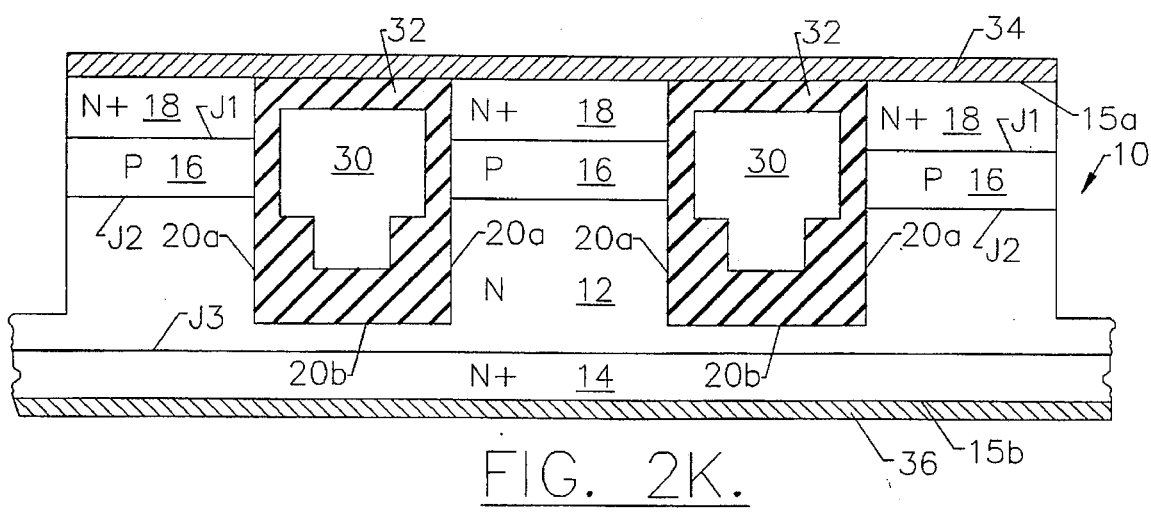

A third electrically insulating region 32 is then formed on the etched second polycrystalline silicon region 30 by oxidizing the second polycrystalline silicon region 30, as illustrated by FIG. 2I. The stress relief oxide layer 22a and the oxide barrier layer 22b (e.g., $Si_3N_4$) are then etched to expose the source region 18 and channel region 16 at the first face 15a, as illustrated by FIG. 2J. A source metal contact layer 34 is then deposited on the first face 15a and a drain metal contact layer 36 is deposited on an opposing second face 151b to form ohmic contacts to the source and channel regions (18 and 16) and drain region 14, respectively, as illustrated by FIG. 2K. As described above, the source metal contact layer 34 will also ohmically contact the portions of the channel region 16 which extend to the first face 15 in the third dimension (not shown).

Figure 3:
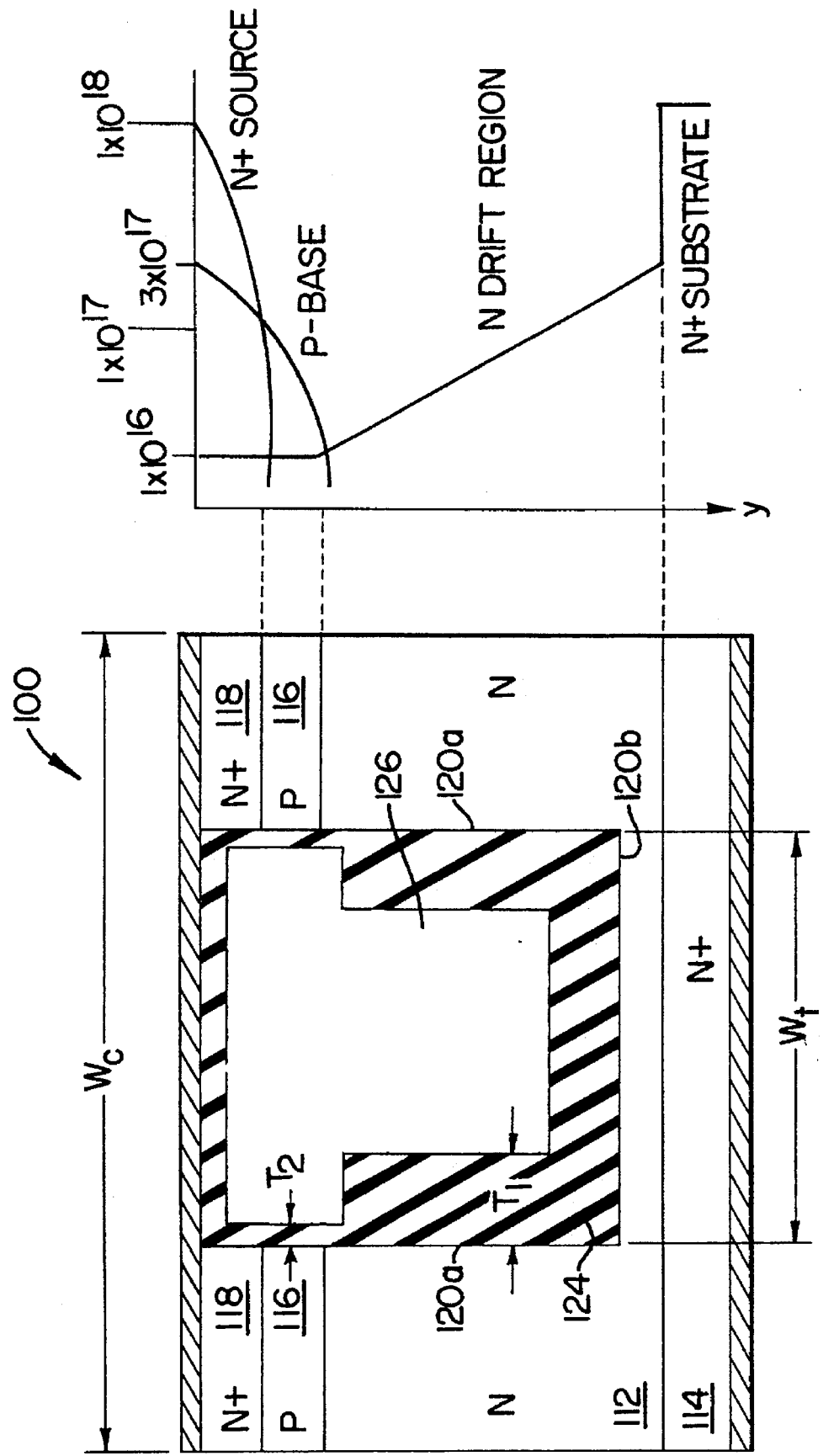
FIG. 3 illustrates a cross section of a unit cell and doping profile therein for a field effect transistor according to the present invention.

Referring now to FIG. 3, a unit cell 100 of a silicon field effect transistor according to a preferred embodiment of the present invention and a graph of the doping profiles of the layers therein are illustrated. The unit cell 100 has a width "$W_c$" of 1 μm and comprises a highly doped drain layer 114 of first conductivity type (e.g., N+), a drift layer 112 of first conductivity type having a linearly graded doping concentration, a relatively thin channel layer 116 of second conductivity type (e.g., P-type) and a highly doped source layer 118 of first conductivity type (e.g., N+), arranged as illustrated. In particular, the drift layer 112 is preferably formed by epitaxially growing an N-type in-situ doped monocrystalline silicon layer having a thickness of 4 μm on an N-type drain layer 114 (e.g., substrate) having a thickness of 100 μm and a doping concentration of greater than $1\times10^{18}$ $cm^{-3}$ (e.g. $1\times10^{19}$ $cm^{-3}$). As illustrated, the drift layer 112 has a linearly graded doping concentration therein with a maximum concentration of $3\times10^{17}$ $cm^{-3}$ at the N+/N junction with the drain layer 114 and a minimum concentration of $1\times10^{16}$ $cm^{-3}$, beginning at a distance 3 μm from the N+/N junction and continuing to the first face 15a.

The channel layer 116 is preferably formed by implanting a P-type dopant such as boron into the drift layer 112 at an energy of 100 kEV and a dose of $1\times10^{14}$ $cm^{-2}$. The P-type dopant is then diffused to a depth of 0.5 μm into the drift layer 112. An N-type dopant such as arsenic is then performed at an energy of 50 kEV and a dose of $1\times10^{15}$ $cm^{-2}$. The N-type and P-type dopants are then diffused to a depth of 0.5 μm and 1.0 μm, respectively, to form a vertical stack containing the drain, drift, channel and source layers.

A stripe-shaped trench having a pair of opposing sidewalls 120a which extend in a third dimension (not shown) and a bottom 120b is then formed in the stack. For a unit cell 100 having a width $W_c$ of 1 μm, the trench is preferably formed to have a width "$W_t$" of 0.5 μm at the end of processing. An insulated gate electrode comprising a gate insulating region 124 and an electrically conductive gate 126 (e.g., polysilicon) are then formed in the trench. According to the preferred embodiment, the portion of the insulating region 124 extending adjacent the trench bottom 120b and the drift layer 112 has a thickness "$T_1$" of about 2000 Å to inhibit the occurrence of high electric field crowding at the bottom corners of the trench and to provide a substantially uniform potential gradient along the trench sidewalls 120a. Although not wishing to be bound by any theory, the uniformity of the potential gradient along the trench sidewalls can also be enhanced by making the product of the doping concentration in the drift layer 112 at J3 (e.g., $3\times10^{17}$ $cm^{-3}$) and the width of the mesa between adjacent trenches (e.g., 0.5 μm) within the range of $1\times10^{13}$–$2\times10^{13}$ $cm^{-2}$ and by making the produce of the doping concentration in the drift layer 112 at J2 and the width of the mesa within the range of $1\times10^{11}$–$2\times10^{12}$ $cm^{-2}$. The portion of the insulating region 124 extending adjacent the channel layer 116 and the source layer 118 preferably has a thickness "$T_2$" of about 500 Å to maintain the threshold voltage of the device at about 2–3 volts. Simulations of the unit cell 100 at a gate bias of 15 Volts confirm that a vertical silicon field effect transistor having a maximum blocking voltage capability of 60 Volts and a specific on-resistance ($R_{sp,on}$) of 40 μΩcm², which is four (4) times smaller than the ideal specific on-resistance of 170 μΩcm² for a 60 volt power UMOSFET, can be achieved. Accordingly, it is not necessary to form a uniformly thick 2000 Å gate oxide to achieve 60 volt blocking capability with a resulting increase in threshold voltage and specific on-resistance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A field effect transistor, comprising:

a semiconductor substrate having first and second opposing faces;

a source region of first conductivity type in said substrate, adjacent the first face;

a drain region of first conductivity type in said substrate, adjacent the second face;

a drift region of first conductivity type in said substrate, said drift region extending between said drain region and said source region and having a graded first conductivity type doping concentration therein which decreases in a direction from said drain region to said source region;

a channel region of second conductivity type in said substrate, said channel region extending between said source region and said drift region and forming first and second P-N junctions therewith, respectively;

a trench in said substrate at the first face, said trench having a sidewall extending adjacent said drift region and said channel region; and an insulated gate electrode in said trench, said insulated gate electrode comprising a gate insulating region on the trench sidewall and an electrically conductive gate on the gate insulating region, opposite the trench sidewall, said gate insulating region including a first insulating region of first thickness extending between said channel region and said electrically conductive gate and a second insulating region of second thickness extending between said drift region and said electrically conductive gate, and wherein the second thickness is greater than the first thickness; and wherein said drift region has a linearly graded first conductivity type doping concentration therein which decreases from greater than about $1\times10^{17}$ cm$^{-3}$ to less than about $5\times10^{16}$ cm$^{-3}$ in a direction from said drain region to said channel region.

2. The field effect transistor of claim 1, wherein a thickness of the gate insulating region adjacent the channel region is less than about 1000 Å and wherein a thickness of the gate insulating region adjacent the drift region is greater than about 1000 Å.

3. The field effect transistor of claim 1, wherein a thickness of the gate insulating region adjacent the channel region is less than about 750 Å and wherein a thickness of the gate insulating region adjacent the drift region is greater than about three times the thickness of the gate insulating region adjacent the channel region.

4. The field effect transistor of claim 3, wherein said channel region has a thickness less than 0.6 μm between the first P-N junction and the second P-N junction.

5. A field effect transistor, comprising:

semiconductor substrate having first and second opposing faces:

source region of first conductivity type in said substrate, adjacent the first face;

a drain region of first conductivity type in said substrate, adjacent the second face;

a drift region of first conductivity type in said substrate, said drift region extending between said drain region and said source region and having a graded first conductivity type doping concentration therein which decreases in a direction from said drain region to said source region;

a channel region of second conductivity type in said substrate, said channel region extending between said source region and said drift region and forming first and second P-N junctions therewith, respectively;

a trench in said substrate at the first face, said trench having a sidewall extending adjacent said drift region and said channel region; and an insulated gate electrode in said trench, said insulated gate electrode comprising a gate insulating region on the trench sidewall and an electrically conductive gate on the gate insulating region, opposite the trench sidewall, said gate insulating region including a first insulating region of first thickness extending between said channel region and said electrically conductive gate and a second insulating region of second thickness extending between said drift region and said electrically conductive gate, and wherein the second thickness is greater than the first thickness; and wherein said drift region has a first conductivity type doping concentration therein which decreases monotonically from a level greater than about $1\times10^{17}$ cm$^{-3}$ to less than about $5\times10^{16}$ cm$^{-3}$ in a direction from said drain region to said channel region.

6. A field effect transistor, comprising:

a semiconductor substrate having first and second opposing faces;

a source region of first conductivity type in said substrate, adjacent the first face;

a drain region of first conductivity type in said substrate, adjacent the second face;

a drift region of first conductivity type in said substrate, said drift region extending between said drain region and said source region and having a graded first conductivity type doping concentration therein which decreases in a direction from said drain region to said source region;

a channel region of second conductivity type in said substrate, said channel region extending between said source region and said drift region and forming first and second P-N junctions therewith, respectively;

first and second trenches in said substrate at the first face, said trenches defining a mesa therebetween containing said source and channel regions and having respective facing sidewalls which extend adjacent said drift, channel and source regions; and an insulated gate electrode in said first trench, said insulated gate electrode comprising a rate insulating region on the first trench sidewalls and an electrically conductive gate on the gate insulating region, opposite the first trench sidewall, said gate insulating region including a first insulating region of first thickness extending between said channel region and said electrically conductive gate and a second insulating region of second thickness extending between said drift region and said electrically/conductive gate, and wherein the second thickness is greater than the first thickness;

wherein the first conductivity type doping concentration of said drift region is less than about $2\times10^{16}$ cm$^{-3}$ at the second P-N junction;

wherein said drift region forms a non-rectifying junction with said drain region and wherein the first conductivity type doping concentration of said drift region is no less than about $1\times10^{17}$ cm$^{-3}$ at the non-rectifying junction; and wherein a product of a distance between the facing sidewalls of said first and second trenches and the first conductivity type doping concentration of said drift region at the non-rectifying junction is between $1\times10^{13}$ atoms cm$^{-2}$ and $2\times10^{13}$ atoms cm$^{-2}$.

7. The field effect transistor of claim 6, wherein a product of a distance between the facing sidewalls of said first and second trenches and the first conductivity type doping concentration of said drift region at the second P-N junction is between $1\times10^{11}$ dopant atoms cm$^{-2}$ and $2\times10^{12}$ dopant atoms cm$^{-2}$.

* * * * *